(12) United States Patent
Liu

(10) Patent No.: US 12,666,855 B2
(45) Date of Patent: Jun. 23, 2026

(54) DISPLAY PANEL AND DISPLAY PANEL PREPARATION METHOD

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: Wanting Liu, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 909 days.

(21) Appl. No.: 17/598,282

(22) PCT Filed: Jul. 21, 2021

(86) PCT No.: PCT/CN2021/107526
§ 371 (c)(1),
(2) Date: Sep. 26, 2021

(87) PCT Pub. No.: WO2022/262062
PCT Pub. Date: Dec. 22, 2022

(65) Prior Publication Data
US 2023/0217798 A1 Jul. 6, 2023

(30) Foreign Application Priority Data

Jun. 16, 2021 (CN) .......................... 202110666198.7

(51) Int. Cl.
*H10K 71/00* (2023.01)
*H10K 71/80* (2023.01)
(Continued)

(52) U.S. Cl.
CPC ........... *H10K 71/851* (2023.02); *H10K 71/80* (2023.02); *H10K 77/10* (2023.02); *H10K 59/12* (2023.02);
(Continued)

(58) Field of Classification Search
CPC ...... H10K 71/851; H10K 77/10; H10K 71/80; H10K 59/1201; H10K 59/12
See application file for complete search history.

(56) References Cited

U.S. PATENT DOCUMENTS

| | | | |
|---|---|---|---|
| 2005/0155704 A1* | 7/2005 | Yokajty | .............. H10K 50/8426 445/25 |
| 2014/0042662 A1 | 2/2014 | Tamada et al. | |

FOREIGN PATENT DOCUMENTS

| | | |
|---|---|---|
| CN | 102810512 A | 12/2012 |
| CN | 103515542 A | 1/2014 |

(Continued)

*Primary Examiner* — Christopher A Culbert
(74) *Attorney, Agent, or Firm* — The Roy Gross Law Firm, LLC; Roy D. Gross

(57) ABSTRACT

A display panel and a display panel preparation method thereof are provided. A first buffer layer and a barrier layer are formed on a support base board, and then a second buffer layer is prepared on the barrier layer. In addition, the first buffer layer is illuminated by a mask process, so that an adhesive force between the first buffer layer and the barrier layer is reduced. The second buffer layer continues to be prepared, and the second buffer layer is a transparent film layer. Therefore, light transmitting performance and the display effect of the panel are effectively improved.

16 Claims, 5 Drawing Sheets

(51) Int. Cl.
  *H10K 77/10*      (2023.01)
  *H10K 59/12*      (2023.01)
  *H10K 59/17*      (2023.01)

(52) U.S. Cl.
  CPC ......... *H10K 59/1201* (2023.02); *H10K 59/17*
                                                   (2023.02)

(56)                       References Cited

FOREIGN PATENT DOCUMENTS

| | | | | | |
|---|---|---|---|---|---|
| CN | 103619591 | A | | 3/2014 | |
| CN | 106887407 | A | * | 6/2017 | |
| CN | 107039594 | A | | 8/2017 | |
| CN | 108428666 | A | | 8/2018 | |
| CN | 109087932 | A | | 12/2018 | |
| CN | 109841734 | A | | 6/2019 | |
| CN | 110234687 | A | | 9/2019 | |
| CN | 110783347 | A | | 2/2020 | |
| CN | 111584504 | A | | 8/2020 | |
| CN | 111725277 | A | | 9/2020 | |
| CN | 111951680 | A | * | 11/2020 | ............ G09F 9/301 |
| JP | 2006236626 | A | | 9/2006 | |
| JP | 6376271 | B1 | | 8/2018 | |
| JP | 2019137865 | A | | 8/2019 | |

* cited by examiner

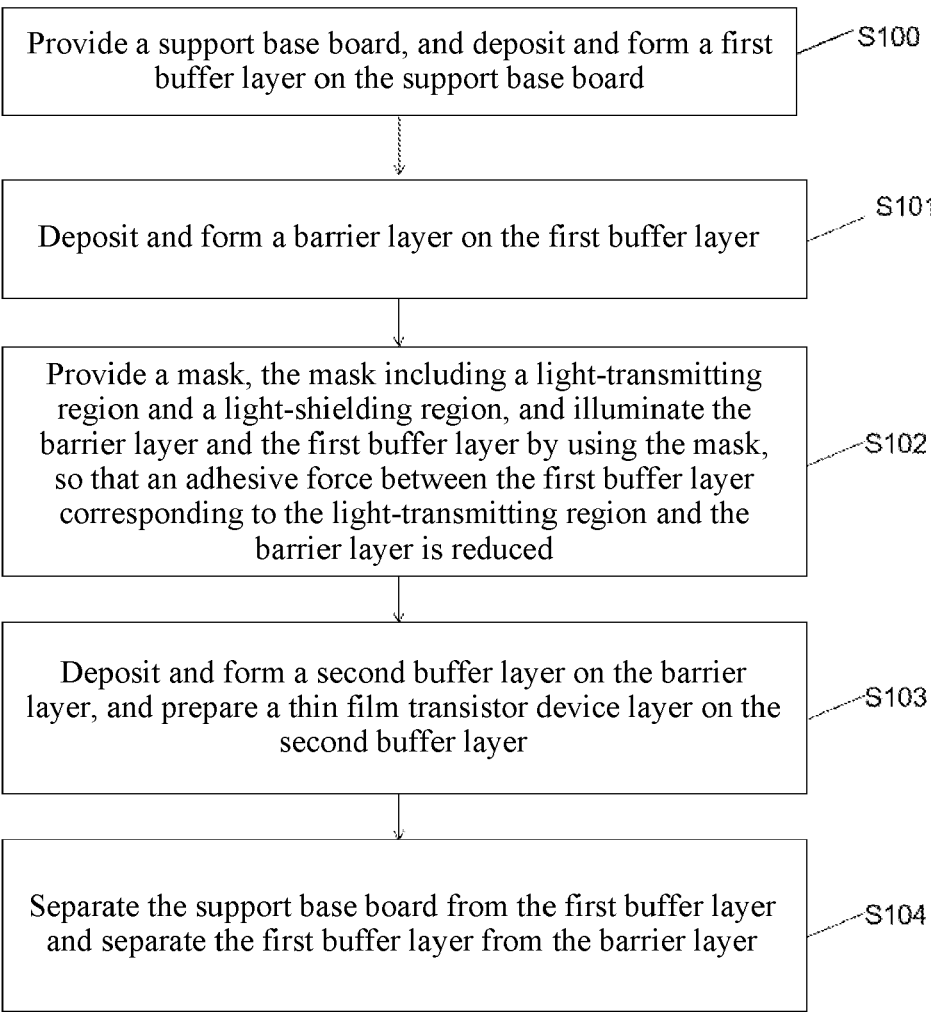

| Provide a support base board, and deposit and form a first buffer layer on the support base board | S100 |

Deposit and form a barrier layer on the first buffer layer — S101

Provide a mask, the mask including a light-transmitting region and a light-shielding region, and illuminate the barrier layer and the first buffer layer by using the mask, so that an adhesive force between the first buffer layer corresponding to the light-transmitting region and the barrier layer is reduced — S102

Deposit and form a second buffer layer on the barrier layer, and prepare a thin film transistor device layer on the second buffer layer — S103

Separate the support base board from the first buffer layer and separate the first buffer layer from the barrier layer — S104

FIG. 2

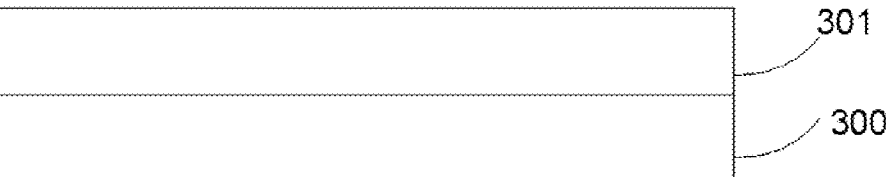

DISPLAY PANEL AND DISPLAY PANEL PREPARATION METHOD

CROSS REFERENCE TO RELATED APPLICATIONS

This application is a National Phase of PCT Patent Application No. PCT/CN2021/107526 having International filing date of Jul. 21, 2021, which claims the benefit of priority of Chinese Application No. 202110666198.7 filed on Jun. 16, 2021. The contents of the above applications are all incorporated by reference as if fully set forth herein in their entirety.

BACKGROUND

Technical Field

This application relates to the field of display panel preparation technologies, and in particular, to a display panel and a display panel preparation method.

Related Art

With the continuous improvement in display panel preparation technologies, people's requirements for the quality and performance of display panels and display apparatuses are increasingly high.

At present, mainstream display screens mainly include an organic light-emitting diode (OLED) display screen and a liquid crystal display screen. The liquid crystal display screen requires a backlight module, which consumes much power. Because the OLED display screen can emit light, it does not require such a backlight module. Therefore, the OLED display screen is more energy-efficient and more environmentally-friendly. In addition, the OLED display screen is flexible, so the flexible OLED is widely applied to various devices. In the conventional flexible display screens, a flexible base board of an OLED is usually set as a double polyimide film layer when the OLED is prepared. Commonly used polyimide film layers include a yellow polyimide film layer and a transparent polyimide film layer. The yellow polyimide material has good thermal properties, mechanical properties, and stability. However, the yellow polyimide has a low transmittance, a high yellow value, and other optical defects, and therefore, the yellow polyimide film layer is difficult to meet requirements of a transparent display technology. In another aspect, if the transparent polyimide film layer is used, due to poor thermal properties and mechanical properties of the transparent polyimide, a problem of a stress mismatch between the transparent polyimide base board and another film layer at a high temperature is easy to occur in the conventional preparation technology. This will lead to such a problem as tearing between the base board and the another film layer, which is not conducive to the improvement of the comprehensive performance of OLED devices.

Therefore, it is necessary to provide solutions to the problems in the related art.

SUMMARY

Technical Problem

In summary, in the preparation of a conventional OLED panel, a flexible polyimide base board cannot be well matched with other film layers in stress, and the transmittance of the flexible film layer is low.

Solutions to Problem

Technical Solutions

To resolve the foregoing problem, embodiments of this application provide a display panel and a display panel preparation method, to resolve problems of a low transmittance of the flexible film layer in the conventional OLED display panel and a poor display effect of the display panel.

In order to resolve the foregoing technical problem, the embodiments of this application provide the following technical solutions:

According to a first aspect of the embodiments of this application, a display panel preparation method is provided, comprising the following steps:

providing a support base board, and depositing and forming a first buffer layer on the support base board;

depositing and forming a barrier layer on the first buffer layer;

providing a mask, the mask comprising a light-transmitting region and a light-shielding region, and illuminating the barrier layer and the first buffer layer by using the mask, so that an adhesive force between the first buffer layer corresponding to the light-transmitting region and the barrier layer is reduced;

depositing and forming a second buffer layer on the barrier layer, and preparing a thin film transistor device layer on the second buffer layer, a thickness of the prepared second buffer layer ranging from 6 μm to 15 μm; and separating the support base board from the first buffer layer and separating the first buffer layer from the barrier layer.

According to an embodiment of this application, after the first buffer layer is illuminated, the adhesive force between the first buffer layer and the barrier layer is less than an adhesive force between the second buffer layer and the barrier layer.

According to an embodiment of this application, a transmittance of the second buffer layer is greater than a transmittance of the first buffer layer.

According to an embodiment of this application, the first buffer layer is a yellow polyimide film layer, and the second buffer layer is a transparent polyimide film layer.

According to an embodiment of this application, mask processing is performed on the display panel by using ultraviolet light as illumination light, a wavelength of the ultraviolet light ranges from 300 nm to 400 nm, an illumination power ranges from 0.1 W to 1 W, and illumination lasts for 8 minutes to 30 minutes at room temperature.

According to an embodiment of this application, the adhesive force between the second buffer layer and the barrier layer ranges from 0.2 N/cm to 5 N/cm, and after the mask processing is performed on the first buffer layer, the adhesive force between the first buffer layer and the barrier layer is less than 0.2 N/cm.

According to an embodiment of this application, the preparing the first buffer layer specifically comprises the following steps:

coating the support base board with a buffer solution, baking for 20 minutes to 80 minutes at a temperature ranging from 370° C. to 460° C. to form a film layer, and removing excess buffer solution; and placing the support base board into pure nitrogen to cause the film layer to undergo a condensation reaction, to obtain the first buffer layer.

According to an embodiment of this application, the preparing the second buffer layer further comprises the following steps:

coating the barrier layer with a buffer solution corresponding to the second buffer layer, baking for 20 minutes to 35 minutes at a temperature ranging from 50° C. to 460° C. to form a film layer, and removing excess buffer solution; and placing the support base board into pure nitrogen to cause the film layer to undergo a condensation reaction, to obtain the first buffer layer.

According to an embodiment of this application, after the first buffer layer is separated, the method further comprises following step:

cutting the display panel, and separating the first buffer layer from the barrier layer after the display panel is cut.

According to a second aspect of the embodiments of this application, a display panel preparation method is provided, comprising the following steps:

providing a support base board, and depositing and forming a first buffer layer on the support base board;

depositing and forming a barrier layer on the first buffer layer;

providing a mask, the mask comprising a light-transmitting region and a light-shielding region, and illuminating the barrier layer and the first buffer layer by using the mask, so that an adhesive force between the first buffer layer corresponding to the light-transmitting region and the barrier layer is reduced;

depositing and forming a second buffer layer on the barrier layer, and preparing a thin film transistor device layer on the second buffer layer; and separating the support base board from the first buffer layer and separating the first buffer layer from the barrier layer.

According to an embodiment of this application, after the first buffer layer is illuminated, the adhesive force between the first buffer layer and the barrier layer is less than an adhesive force between the second buffer layer and the barrier layer.

According to an embodiment of this application, a transmittance of the second buffer layer is greater than a transmittance of the first buffer layer.

According to an embodiment of this application, the first buffer layer is a yellow polyimide film layer, and the second buffer layer is a transparent polyimide film layer.

According to an embodiment of this application, mask processing is performed on the display panel using ultraviolet light as illumination light, a wavelength of the ultraviolet light ranging from 300 nm to 400 nm, an illumination power ranges from 0.1 W to 1 W, and illumination lasts for 8 minutes to 30 minutes at room temperature.

According to an embodiment of this application, the adhesive force between the second buffer layer and the barrier layer is between 0.2 N/cm and 5 N/cm, and after the mask processing is performed on the first buffer layer, the adhesive force between the first buffer layer and the barrier layer is less than 0.2 N/cm.

According to an embodiment of this application, the preparing the first buffer layer specifically comprises the following steps:

coating the support base board with a buffer solution, baking for 20 minutes to 80 minutes at a temperature ranging from 370° C. to 460° C. to form a film layer, and removing excess buffer solution; and placing the support base board into pure nitrogen to cause the film layer to undergo a condensation reaction, to obtain the first buffer layer.

According to an embodiment of this application, the preparing the second buffer layer further comprises the following steps:

coating the barrier layer with a buffer solution corresponding to the second buffer layer, baking for 20 minutes to 35 minutes at a temperature ranging from 50° C. to 460° C. to form a film layer, and removing excess buffer solution; and placing the support base board into pure nitrogen to cause the film layer to undergo a condensation reaction, to obtain the first buffer layer.

According to an embodiment of this application, after the first buffer layer is separated, the method further comprises the following step:

cutting the display panel, and separating the first buffer layer from the barrier layer after the display panel is cut.

According to a third aspect of the embodiments of this application, a display panel is further provided, comprising:

a substrate;

a thin film transistor device layer, disposed on the substrate; and an encapsulation layer, disposed on the thin film transistor device layer, the substrate comprising a barrier layer and a buffer layer, the buffer layer being disposed on the barrier layer, the buffer layer being a transparent film layer; and the barrier layer and the buffer layer being prepared by using the preparation method provided in the embodiments of this application.

According to an embodiment of this application, the transparent film layer is a transparent polyimide film layer.

Beneficial Effects of the Invention

Beneficial Effects

In summary, beneficial effects of the embodiments of this application are as follows:

The embodiments of this application provide a display panel and a display panel preparation method. During preparation, a first buffer layer is first formed on a support base board, a barrier layer is formed on the buffer layer, and then a second buffer layer is prepared on the barrier layer. After the first buffer layer is prepared, the first buffer layer is illuminated by using a mask process, so that an adhesive force between the first buffer layer and the barrier layer is reduced. The second buffer layer continues to be prepared, and the second buffer layer is a transparent film layer. Finally, a thin film transistor device layer and an encapsulation layer are prepared. When a panel is finally formed through cutting, because the adhesive force between the first buffer layer and the barrier layer is relatively small and the second buffer layer is a transparent film layer, light transmitting performance of the panel is effectively improved, and the display effect of the panel is also improved.

BRIEF DESCRIPTION OF THE DRAWINGS

FIG. 2 is a schematic flowchart of a display panel preparation process according to an embodiment of this application;

FIG. 3 to FIG. 7 are schematic diagrams of a film layer structure corresponding to a display panel preparation process according to an embodiment of this application.

DETAILED DESCRIPTION

The following description of various embodiments is provided to exemplify the specific embodiments of this application with reference to accompanying drawings.

With the continuous expansion of the application range of flexible display panels, the display panels prepared are expected to have better light-emitting performance and a better display effect. However, in a process of preparing a display panel, each film layer in the panel plays an important role in the light-emitting effect of the display panel. The embodiments of this application provide a display panel and a display panel preparation method, where a film layer structure and a film layer material in the display panel are changed to effectively improve a transmittance of the display panel, and improve a light-emitting effect of the display panel and a preparation process of the display panel.

Figure 1:
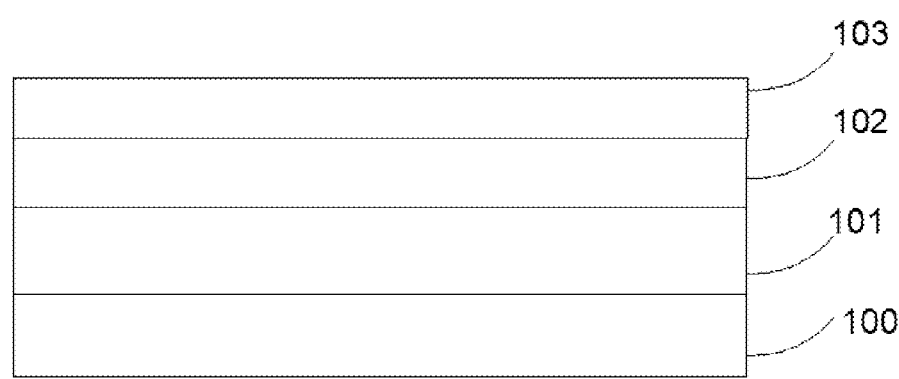
FIG. 1 is a schematic diagram of a film layer structure of a display panel according to an embodiment of this application.

FIG. 1 is a schematic diagram of a film layer structure of a display panel according to an embodiment of this application. The display panel includes a substrate base board 100, a buffer layer 101, a thin film transistor device layer 102, and an encapsulation layer 103.

Specifically, the buffer layer 101 is disposed on the substrate base board 100, the thin film transistor device layer 102 is disposed on the buffer layer 101, and the encapsulation layer 103 is disposed on the thin film transistor device layer 102.

In this embodiment of this application, in the process of setting the buffer layer 101, the buffer layer 101 is set as a transparent buffer film layer. Because the buffer layer 101 is set as a transparent film layer, the buffer layer 101 may effectively improve a transmittance of the substrate base board 100, and further effectively improve transparent display of the display panel.

Specifically, in the process of setting the buffer layer 101, the buffer layer 101 may be set as a transparent polyimide film layer. The transparent polyimide film layer has a high transmittance, and the transparent polyimide film layer has relatively good flexibility. Therefore, when light is incident on the polyimide film layer, a large fraction of the light is transmitted. Therefore, the transmittance and the display effect of the display panel are effectively improved.

In this embodiment of this application, to further improve a transmittance of the buffer layer 101, a thickness of the film layer of the buffer layer 101 is set between 6 µm and 15 µm. Preferably, the thickness of the film layer of the buffer layer 101 may be set to 10 µm. In this way, while ensuring the support effect of the buffer layer 101, the thickness of the display panel is not increased.

Alternatively, the buffer layer 101 may be set as another transparent film layer. The buffer layer 101 is set as a transparent film layer to effectively improve a transmittance of the base board, so as to improve transparent display of the display panel. A function of the another transparent film layer is the same as that of the transparent polyimide film layer provided in this embodiment of this application, and details are not repeated herein.

Further, FIG. 2 is a schematic flowchart of a display panel preparation process according to an embodiment of this application. The display panel preparation process includes the following steps:

S100: Provide a support base board, and deposit and form a first buffer layer on the support base board.

S101: Deposit and form a barrier layer on the first buffer layer.

S102: Provide a mask, the mask including a light-transmitting region and a light-shielding region, and illuminate the barrier layer and the first buffer layer by using the mask, so that an adhesive force between the first buffer layer corresponding to the light-transmitting region and the barrier layer is reduced.

S103: Deposit and form a second buffer layer on the barrier layer, and prepare a thin film transistor device layer on the second buffer layer.

S104: Separate the support base board from the first buffer layer and separate the first buffer layer from the barrier layer.

FIG. 3 to FIG. 7 are schematic diagrams of a film layer structure corresponding to a display panel preparation process according to an embodiment of this application. The display panel preparation process of the display panel is described with reference to the film layer structure shown in FIG. 3 to FIG. 7.

Specifically, in a preparation process of the display panel, referring to FIG. 3, a support base board 300 is provided first. In this embodiment of this application, the support base board 300 may be set as a glass base board, and a function of supporting and fixing other film layers is implemented by using the glass base board.

After the support base board 300 is disposed, a first buffer layer 301 is further disposed on the support base board 300. In this embodiment of this application, in the process of disposing the first buffer layer 301, a material for preparing the first buffer layer 301 is deposited on and coats the support base board 300. In addition, the coating material is baked into a film, and the first buffer layer 301 provided in this embodiment of this application is finally formed.

Specifically, an example in which the first buffer layer 301 provided in this embodiment of this application is a yellow polyimide film layer is used for description. In the process of preparing the yellow polyimide film layer, the support base board 300 is evenly coated with a pre-prepared yellow polyamide acid solution. During coating, the coating may be performed by using a spin dip coating process. Therefore, it is ensured that thicknesses of the formed film layer at parts of the support base board 300 are consistent.

After the coating, the solution used for coating is baked to dry, and the first buffer layer 301 provided in this embodiment of this application is finally formed by using the solution.

Specifically, in the process of baking the solution, the method further includes the following steps:

The support base board 300 coated with the yellow polyamide acid solution is transferred to a high-purity nitrogen atmosphere, and a temperature is increased to 370° C. to 460° C. In this embodiment of this application, the temperature is increased to 370° C., and the solution is baked for 80 min at the temperature of 370° C., so that the solution is heated and dehydrated and a condensation reaction occurs, until a solution on a surface of the support base board 300 is fully cured to form the first buffer layer 301 provided in this embodiment of this application.

Preferably, in the process of baking the solution on the support base board 300, the support base board 300 is transferred to a high-purity nitrogen atmosphere, and the temperature is increased to 460° C. In addition, the solution continues to be baked for 20 min at the temperature of 460° C., until the solution is fully cured to form the first buffer layer 301.

After the first buffer layer 301 is prepared, excess solution and the first buffer layer 301 are removed.

Figure 4:
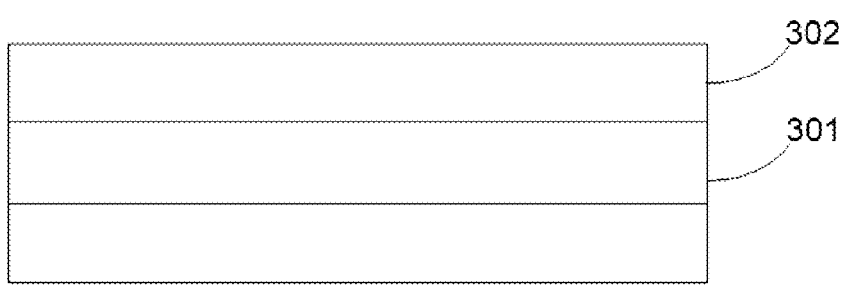

Referring to FIG. 4, a barrier layer 302 continues to be prepared. The barrier layer 302 is prepared on the first buffer layer 301. In this embodiment of this application, the first buffer layer 301 may be directly coated with a barrier solution, and the barrier solution is dried to finally form the barrier layer 302 provided in this application.

The barrier layer 302 may be made of an inorganic material, and preferably may be made of SiNx and other materials, to ensure a barrier against external water vapor, oxygen, and other substances, and to prevent the external water vapor and other substances from affecting the display panel and reducing comprehensive performance of the display panel.

Preferably, in the process of preparing the barrier layer 302, the prepared barrier layer 302 may be alternatively attached to the first buffer layer 301 directly. After the preparation, an adhesive force between the first buffer layer 301 and the barrier layer 302 is between 0.2 N/cm and 5 N/cm, so as to ensure an adhesion effect between the two film layers.

Figure 5:
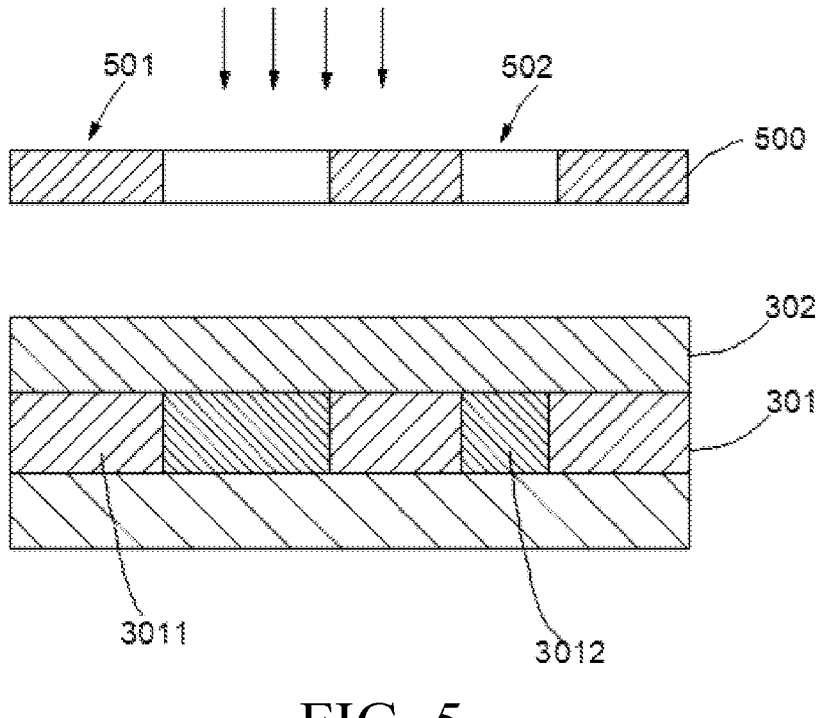

Referring to FIG. 5, after the barrier layer is prepared, mask processing is performed on the display panel. The mask process can change the adhesive force between film layers in the display panel, so as to change performance of the film layers.

Specifically, a mask 500 is provided. In this embodiment of this application, the mask 500 includes a plurality of light-transmitting regions 502 and a plurality of light-shielding regions 501. When light illuminates, the light can penetrate from the light-transmitting regions 502 completely, but cannot penetrate from the light-shielding regions 501. Therefore, performance of corresponding film layers in only the light-transmitting regions 502 can be changed.

During illumination, the mask 500 is disposed above the barrier layer 302, and the mask 500 is illuminated by ultraviolet light. To improve a processing effect of the ultraviolet light on the film layer, in this embodiment of this application, a wavelength of the ultraviolet light for illumination is selected as 300 nm, and an illumination power of the ultraviolet light is selected as 0.1 W to 1 W. After the foregoing parameters are determined, illumination lasts for 30 min at room temperature.

After the illumination, adhesion performance of the first buffer layer 301 is changed under an action of the ultraviolet light. Specifically, during illumination, adhesion performance of a film layer in an illumination region 3012 of the first buffer layer 301 is changed, while adhesion performance of a film layer in a non-illumination region 3011 is not changed. Therefore, an adhesive force of the first buffer layer 301 in a region corresponding to the light-transmitting region 502 is reduced, but an adhesive force of the first buffer layer 301 in a region corresponding to the light-shielding region 501 is not changed. Therefore, different adhesive forces are formed in different regions of the first buffer layer 301, to facilitate subsequent processing on the first buffer layer 301.

Preferably, in the process of setting parameters of the ultraviolet light, the wavelength of the ultraviolet light may alternatively be set to 400 nm, and an illumination power is set to 0.1 W to 1 W. In addition, illumination lasts for 8 min at room temperature. The first buffer layer 301 is processed completely.

In this embodiment of this application, after the illumination, the adhesive force between the first buffer layer 301 corresponding to the light-transmitting region 502 and the barrier layer 302 is less than 0.2 N/cm. In this case, in the process of removing the film layer in the region subsequently, the first buffer layer 301 can be removed from the barrier layer 302 relatively easily, to further effectively improve the display panel preparation process.

Figure 6:
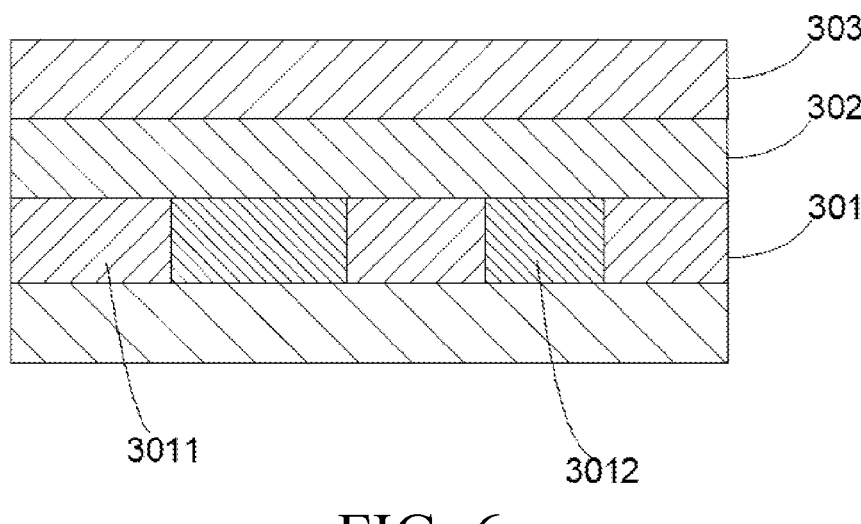

Referring to FIG. 6, after the illumination, other film layers continue to be prepared. In this embodiment of this application, a second buffer layer 303 is prepared on the barrier layer 302.

Specifically, in the process of preparing the second buffer layer 303, the barrier layer 302 is evenly coated with a pre-prepared transparent polyamide acid solution. During coating, the coating may be performed by using a spin dip coating process. Therefore, it is ensured that thicknesses of the formed film layer at parts of the barrier layer 302 are consistent.

After the coating, the solution used for coating is baked to dry, and the second buffer layer 303 provided in this embodiment of this application is finally formed by using the solution, a thickness of a film layer of the formed second buffer layer 303 being 6 μm to 15 μm.

Specifically, in the process of baking the solution, the method further includes the following steps:

The barrier layer 302 coated with the transparent polyamide acid solution is transferred to a high-purity nitrogen atmosphere, and a temperature is increased to 350° C. to 460° C. In this embodiment of this application, the temperature is increased to 350° C., and the solution is baked for 35 min at the temperature of 350° C., so that the solution is heated and dehydrated and a condensation reaction occurs, until a solution on a surface of the barrier layer 302 is fully cured to form the second buffer layer 303 provided in this embodiment of this application.

Preferably, in the process of baking the solution on the barrier layer 302, the barrier layer 302 may alternatively be transferred to a high-purity nitrogen atmosphere, and the temperature is increased to 460° C. In addition, the solution continues to be baked for 20 min or 30 min at the temperature of 460° C., until the solution is fully cured to form the second buffer layer 303.

After the second buffer layer 303 is prepared, excess solution and an undesired part of the second buffer layer 303 are removed, to finally form the transparent film layer required in this embodiment of this application. When light illuminates, the display panel has the largest transmittance, so as to effectively improve the display effect of the display panel.

In this embodiment of this application, a transmittance of the second buffer layer 303 is greater than a transmittance of the first buffer layer 301.

Figure 7:
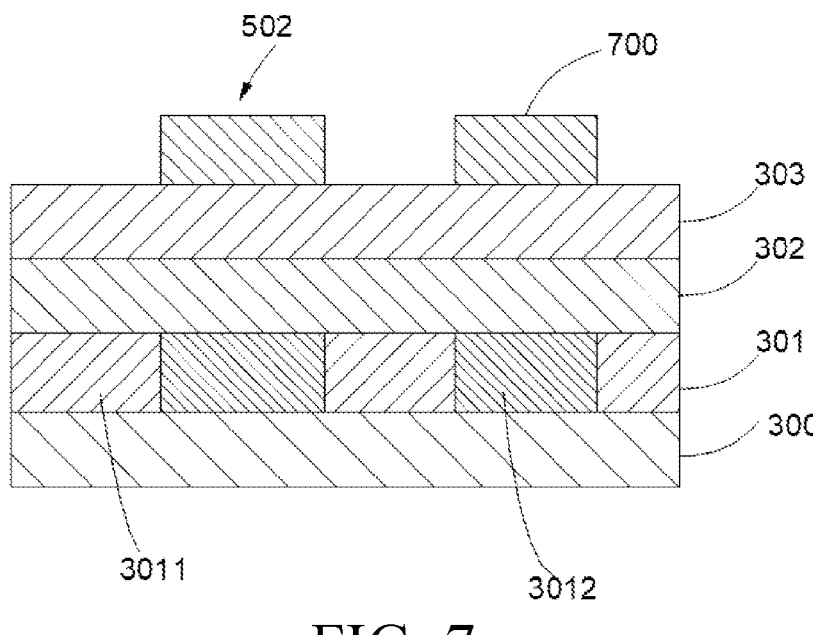

Referring to FIG. 7, after the second buffer layer 303 is prepared, other film layers continue to be prepared. In this embodiment of this application, a thin film transistor device layer 700 is prepared on the second buffer layer 303 corresponding to the light-transmitting region 502. However, the thin film transistor device layer 700 is not disposed on the second buffer layer 303 corresponding to the light-shielding region. After the thin film transistor device layer 700 is disposed, a protection film layer such as an encapsulation layer is further disposed on the thin film transistor device layer 700. Therefore, the film layer in the display panel prepared in this embodiment of this application not only has the thermal properties, mechanical properties, and stability of the yellow polyimide, but also can be removed subsequently. Stress matching between the film layers is relatively good, and the display panel has a relatively high transmittance.

Figure 8:
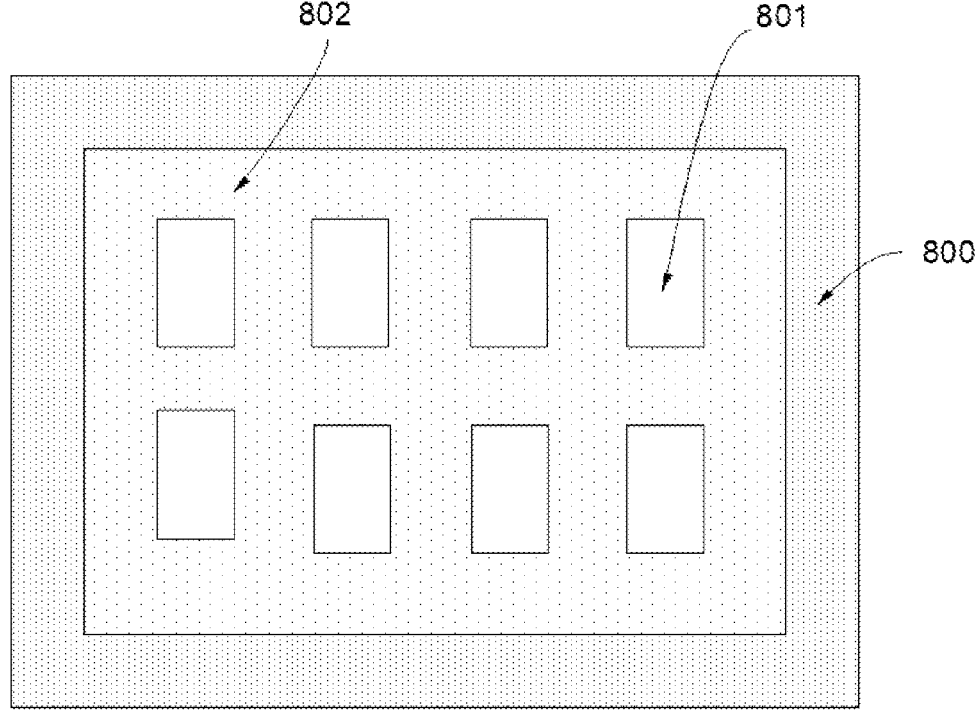
FIG. 8 is a top view of a display panel prepared according to an embodiment of this application.

FIG. 8 is a top view of a display panel prepared according to an embodiment of this application. A first region 800 corresponds to the support base board 300 and a film layer in a region of the first buffer layer 301 disposed on the support base board 300. A second region 802 corresponds to the barrier layer 302 and a film layer in a region of the second buffer layer 303 disposed on the barrier layer 302. In addition, a third region 801 corresponds to a thin film transistor device layer of the display panel.

In this embodiment of this application, an area of the first region 800 is greater than an area of the second region 802, and the area of the second region 802 is greater than an area of the third region 801. In addition, in the process of performing mask processing on the display panel, a structure of a mask thereof corresponds to the structure in FIG. 8 in this embodiment of this application, so as to ensure a mask processing effect.

After structures of film layers are prepared on the support base board 300, the support base board is cut. Specifically, during cutting, the cutting is performed along an edge corresponding to the third region 801, and after the cutting, a plurality of display panels of required sizes is formed.

After the cutting is finished, the display panel continues to be processed. Excess film layers need to be removed in this embodiment of this application. Specifically, the support base board and the first buffer layer formed during the preparation need to be removed. After the third region 801 is illuminated, an adhesive force between the first buffer layer in the third region 801 and the barrier layer is reduced. Therefore, by using a laser lift-off process, the support base board may be separated from the first buffer layer, and the first buffer layer may be separated from the barrier layer. Finally, the display panel in this embodiment of this application is formed. The second buffer layer in the display panel is a transparent film layer, to further effectively improve a transmittance of the display panel, and improve the display effect of the display panel.

A display panel and a display panel preparation method provided in the embodiments of this application are described in detail above. The principles and implementations of this application are described through specific examples in this specification, and the descriptions of the embodiments are only intended to help understand the technical solutions and core ideas of this application. It should be understood by a person of ordinary skill in the art that, modifications can be made to the technical solutions described in the foregoing embodiments, or equivalent replacements can be made to some technical features in the technical solutions; and these modifications or replacements will not cause the essence of corresponding technical solutions to depart from the scope of the technical solutions in the embodiments of this application.

What is claimed is:

1. A display panel preparation method, comprising following steps:
   providing a support base board, and depositing and forming a first buffer layer on the support base board;
   depositing and forming a barrier layer on the first buffer layer;
   providing a mask, the mask comprising a light-transmitting region and a light-shielding region, and illuminating the barrier layer and the first buffer layer using the mask, so that an adhesive force between the first buffer layer corresponding to the light-transmitting region and the barrier layer is reduced;
   depositing and forming a second buffer layer on the barrier layer, and preparing a thin film transistor device layer on the second buffer layer, a thickness of the prepared second buffer layer ranging from 6 μm to 15 μm;
   forming a thin film transistor device layer on the second buffer layer corresponding to the light-transmitting region and not on the second buffer layer corresponding to the light-shielding region;
   cutting the display panel along an edge corresponding to the light-transmitting region to obtain a plurality of display sub-panels; and
   processing the plurality of display sub-panels by a laser lifting off process to separate the support base board from the first buffer layer and separate the first buffer layer from the barrier layer.

2. The display panel preparation method according to claim 1, wherein after the first buffer layer is illuminated, the adhesive force between the first buffer layer and the barrier layer is less than an adhesive force between the second buffer layer and the barrier layer.

3. The display panel preparation method according to claim 2, wherein a transmittance of the second buffer layer is greater than a transmittance of the first buffer layer.

4. The display panel preparation method according to claim 3, wherein the first buffer layer is a yellow polyimide film layer, and the second buffer layer is a transparent polyimide film layer.

5. The display panel preparation method according to claim 1, wherein mask processing is performed on the display panel by using ultraviolet light as illumination light, a wavelength of the ultraviolet light ranges from 300 nm to 400 nm, an illumination power ranges from 0.1 W to 1 W, illumination lasting for 8 minutes to 30 minutes at room temperature.

6. The display panel preparation method according to claim 1, wherein the adhesive force between the second buffer layer and the barrier layer ranges from 0.2 N to 5 N, and after the mask processing is performed on the first buffer layer, the adhesive force between the first buffer layer and the barrier layer is less than 0.2 N.

7. The display panel preparation method according to claim 1, wherein forming the first buffer layer comprises following steps:
   coating the support base board with a buffer solution, baking for 20 minutes to 80 minutes at a temperature from 370° C. to 460° C. to form a film layer, and removing excess buffer solution; and
   placing a structure including the support base board and the film layer into pure nitrogen to cause the film layer to undergo a condensation reaction, to change the film layer to the first buffer layer.

8. The display panel preparation method according to claim 1, wherein forming the second buffer layer further comprises the following steps:
   coating the barrier layer with a buffer solution corresponding to the second buffer layer, baking for 20 minutes to 35 minutes at a temperature from 350° C. to 460° C. to form a film layer, and removing excess buffer solution; and
   placing a structure including the support base board, the first buffer layer, and the film layer into pure nitrogen to cause the film layer to undergo a condensation reaction, to change the film layer to the first buffer layer.

9. A display panel preparation method, comprising the following steps:

providing a support base board, and depositing and forming a first buffer layer on the support base board;

depositing and forming a barrier layer on the first buffer layer;

providing a mask, the mask comprising a light-transmitting region and a light-shielding region, and illuminating the barrier layer and the first buffer layer using the mask, so that an adhesive force between the first buffer layer corresponding to the light-transmitting region and the barrier layer is reduced;

depositing and forming a second buffer layer on the barrier layer, and preparing a thin film transistor device layer on the second buffer layer;

forming a thin film transistor device layer on the second buffer layer corresponding to the light-transmitting region and not on the second buffer layer corresponding to the light-shielding region;

cutting the display panel along an edge corresponding to the light-transmitting region to obtain a plurality of display sub-panels; and processing the plurality of display sub-panels by a laser lifting off process to separate the support base board from the first buffer layer and separate the first buffer layer from the barrier layer.

10. The display panel preparation method according to claim 9, wherein after the first buffer layer is illuminated, the adhesive force between the first buffer layer and the barrier layer is less than an adhesive force between the second buffer layer and the barrier layer.

11. The display panel preparation method according to claim 10, wherein a transmittance of the second buffer layer is greater than a transmittance of the first buffer layer.

12. The display panel preparation method according to claim 11, wherein the first buffer layer is a yellow polyimide film layer, and the second buffer layer is a transparent polyimide film layer.

13. The display panel preparation method according to claim 9, wherein mask processing is performed on the display panel by using ultraviolet light as illumination light, a wavelength of the ultraviolet light ranges from 300 nm to 400 nm, an illumination power ranges from 0.1 W to 1 W, illumination lasting for 8 minutes to 30 minutes at room temperature.

14. The display panel preparation method according to claim 9, wherein the adhesive force between the second buffer layer and the barrier layer range from 0.2 N to 5 N, and after the mask processing is performed on the first buffer layer, the adhesive force between the first buffer layer and the barrier layer is less than 0.2 N.

15. The display panel preparation method according to claim 9, wherein forming the first buffer layer specifically comprises the following steps:

coating the support base board with a buffer solution, baking for 20 minutes to 80 minutes at a temperature from 370° C. to 460° C. to form a film layer, and removing excess buffer solution; and placing a structure including the support base board and the film layer into pure nitrogen to cause the film layer to undergo a condensation reaction, to change the film layer to the first buffer layer.

16. The display panel preparation method according to claim 9, wherein forming the second buffer layer further comprises following steps:

coating the barrier layer with a buffer solution corresponding to the second buffer layer, baking for 20 minutes to 35 minutes at a temperature from 350° C. to 460° C. to form a film layer, and removing excess buffer solution; and placing a structure including the support base board, the first buffer layer, and the film layer into pure nitrogen to cause the film layer to undergo a condensation reaction, to change the film layer to the first buffer layer.

* * * * *